United States Patent [19]

Rogers

[11] Patent Number: 4,460,917
[45] Date of Patent: Jul. 17, 1984

[54] MOLDED-IN ISOLATION BUSHING FOR SEMICONDUCTOR DEVICES

[75] Inventor: William O. Rogers, Tempe, Ariz.

[73] Assignee: Motorola, Inc., Schaumburg, Ill.

[21] Appl. No.: 384,697

[22] Filed: Jun. 3, 1982

[51] Int. Cl.$^3$ .................... H01L 23/32; H01L 23/08; H01L 23/30
[52] U.S. Cl. ........................................ 357/81; 357/79; 357/80; 357/74; 174/16 HS; 174/153 G
[58] Field of Search ............... 174/153 R, 153 G, 142, 174/152 R, 16 HS; 357/81, 79, 74, 80, 72

[56] References Cited

U.S. PATENT DOCUMENTS

| | | | |
|---|---|---|---|
| 3,369,597 | 2/1968 | Dronsuth et al. | 174/16 HS |
| 3,514,529 | 5/1970 | Keto | 174/153 R |
| 3,728,584 | 4/1973 | Kuhlow | 174/152 R X |
| 3,801,874 | 4/1974 | Stefani | 357/81 X |
| 4,068,368 | 1/1978 | Debard et al. | 357/79 X |
| 4,259,685 | 3/1981 | Romano | 357/79 X |

FOREIGN PATENT DOCUMENTS

| | | | |
|---|---|---|---|
| 699041 | 3/1952 | United Kingdom | 174/153 R |
| 918369 | 2/1963 | United Kingdom | 174/153 |

OTHER PUBLICATIONS

"Expanding Bushing"–Hufford–Western Electric Technical Digest No. 3, Jul. 1966, pp. 39-40.

*Primary Examiner*—Andrew J. James
*Assistant Examiner*—Sheila V. Clark
*Attorney, Agent, or Firm*—Robert M. Handy

[57] ABSTRACT

An improved molded-in insulated bushing is provided to electrically isolate the mounting fastener used to attach the metallic heat spreader of a semiconductor power device to an external heat sink. The bushing has at one end a flange protruding from one surface of the heat spreader and of sufficient height to exceed the required flash-over voltage. The other end fills a chamfered portion of the heat spreader, and is flush with or relieved from the heat spreader surface which contacts the external heat sink. This shape increases the surface flash-over distance and voltage above that of bushings of the prior art and retains the bushing in the heat spreader. The bushing is advantageously formed during molding of the plastic device encapsulation, but is separated from the encapsulation so that mounting forces are not transmitted through the encapsulation to the semiconductor die and lead wires.

10 Claims, 5 Drawing Figures

MOLDED-IN ISOLATION BUSHING FOR SEMICONDUCTOR DEVICES

TECHNICAL FIELD

This invention relates to improved packages for electrical devices and, more particularly, to a semiconductor device package having a molded-in insulated bushing to electrically isolate the mounting fastener from the conductive heat spreader of the device.

BACKGROUND OF THE INVENTION

Metallic heat spreaders are used in power semiconductor devices to conduct heat from the semiconductor die to an external heat sink. It is thermally most efficient and also least costly to construct the device so that the semiconductor die mounts directly on the heat spreader. This is called a non-isolated device since the heat spreader is electrically connected to the semiconductor die and both are at the same electrical potential. Most power semiconductor devices are made in this way.

In many applications, the semiconductor die must be at one electrical potential while the external heat sink is at a different electrical potential. In the prior art, two approaches have been used to provide electrical isolation of the semiconductor chip while still maintaining thermal coupling to the external heat sink. These are:

(1) inserting a thin ceramic insulator between the semiconductor chip and the heat spreader (isolated device), or (2) placing a thin mica or plastic insulating spacer between the heat spreader and the external heat sink (isolated mounting).

The first of these approaches has the disadvantages of (a) introducing a significant thermal impedance between the semiconductor die and the heat sink at the point of greatest thermal flux, (b) significantly increasing manufacturing costs, and (c) increasing user inventory and handling costs since isolated and non-isolated devices are not interchangeable.

The second approach has the disadvantage that the metallic fastener used to attach the device to the heat sink must also be electrically isolated from the heat spreader and/or the external heat sink, e.g. by means of additional piece parts in the form of insulating bushings. For the user, insulating the fastener is particularly troublesome and expensive to accomplish because of the hand labor required. Thus any reduction in the number of piece parts needed, and in the complexity of the mounting operation is a substantial aid to the user, if it can be accomplished without significant additional cost.

Thus, a need continues to exist for low cost power semiconductor devices and power semiconductor device packages which can be used interchangeably in isolated or non-isolated applications with a minimum of additional piece parts and without a requirement for insulated fasteners.

Accordingly, it is an object of the present invention to provide an improved electrical device in which the mounting hole is electrically isolated from the heat spreader so that a metallic fastener may be used without a requirement for separate insulated bushings or sleeves.

It is a further objective of this invention to provide an improved semiconductor power device in which an insulated mounting bushing is permanently bonded to the conductive heat spreader.

It is an additional object of this invention to provide an improved plastic encapsulated power semiconductor device in which the insulated mounting bushing is formed by molding, substantially at the same time as the plastic encapsulation, and without significant increase in manufacturing costs.

It is a further object of this invention to provide an improved plastic encapsulated power semiconductor device wherein the insulating plastic mounting bushing is separated from the plastic encapsulation covering the semiconductor die, in order to avoid coupling of the mechanical mounting stress from the mounting bushing through the plastic material to the semiconductor die.

It is a yet further object of this invention to provide an insulated mounting bushing which is retained by the heat spreader and whose lower surface is relieved to provide clearance for burrs which may be present on the mounting hole in the external heat sink.

It is an additional object of this invention to provide an improved power semiconductor device wherein the insulated mounting bushing retained in the heat spreader is of a shape to provide increased surface flashover distances, thereby increasing the breakdown voltage of the installed device while avoiding the use of insulated fasteners.

SUMMARY OF THE INVENTION

Attainment of the foregoing and other objectives and advantages is achieved through the present invention wherein a metallic base is provided, having therein a substantially cylindrical first through-hole of a first radius adapted for mounting the base to an external heat sink by means of a fastener, wherein one end of the first through-hole is chamfered to a predetermined depth so as to have a larger second radius at a first surface of the base. A semiconductor die is coupled to the base and an insulating plastic encapsulation molded around the semiconductor die. An insulating plastic bushing is molded substantially simultaneously with but separated from the encapsulation surrounding the semiconductor die. The molded plastic bushing substantially fills the first through-hole in the base and has therein a centrally located second through-hole of a third radius smaller than and coaxial with the first radius of the first through-hole. The plastic bushing also has a flange extending above the second surface of the base and of a fourth radius larger than the first radius.

The flange has a first height above the second surface sufficient to exceed a predetermined flash-over distance. Additionally, the difference between the second and third radii also equals or exceeds the predetermined surface flash-over distance.

In a first embodiment, the end of the bushing adjacent to the chamfer is substantially flush with and does not protrude beyond the first surface of the base, this being the base surface which contacts the external heat sink. In a further embodiment, the insulated plastic bushing is relieved adjacent to the first surface for a distance less than the depth of the chamfer in order to accommodate burrs which may exist at the edge of the mounting hole in the external heat sink.

The through-holes can have other shapes besides cylindrical. The metallic base can be insulated from the external heat sink by an integrally bonded insulating layer or a separate insulating spacer.

DETAILED DESCRIPTION OF THE DRAWINGS

Figure 1:
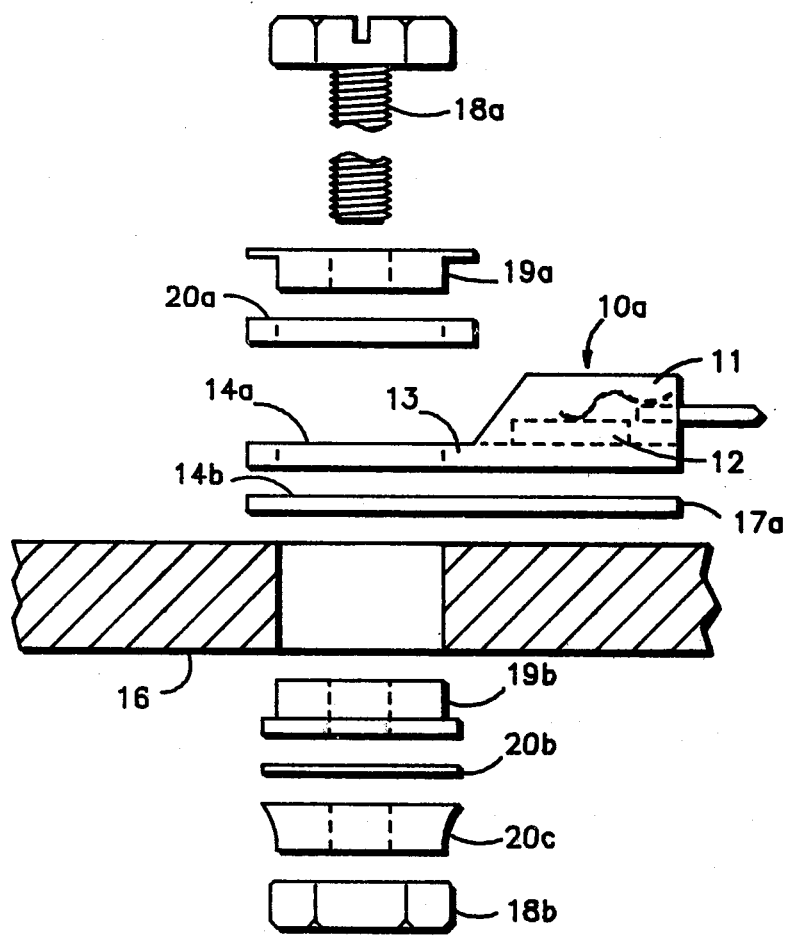
FIG. 1 shows an exploded view of a typical prior art isolated mounting system for a semiconductor device with a non-isolated heat spreader.

FIG. 1 shows a typical prior art system for an isolated mounting of a non-isolated transistor to an electrically conductive heat sink. Semiconductor device 10a has protective encapsulation 11 enclosing semiconductor device 12 which is mounted directly on metallic base and heat spreader 13. Heat spreader 13 has aperture or through-hole 14a for mounting. Semiconductor device 10a is intended to be mounted to external heat sink 16 by means of fastener 18a-b. In order to isolate heat spreader 13 and semiconductor die 12 from external heat sink 16, there is provided insulator 17a which typically has substantially the same shape as heat spreader 13. Insulator 17a has through-hole 14b which aligns with through-hole 14a of heat spreader 13. Insulator 17a is typically of Mica.

In order to isolate fastener 18a-b, there are provided insulated bushings 19a-b. Metallic washers 20a-c are typically provided to assist in aligning the bushings, maintaining the assembled parts in compression, and facilitating tightening of fastener 18a-b. It will be readily apparent to one of skill in the art that isolating semiconductor device 10a and heat sink 16 by such means is both complex and costly. Nevertheless, such mounting systems have been used with virtually no change ever since the first power devices were developed approximately thirty years ago. The need for improvement is therefore both keenly felt and of long standing.

Figure 2A:
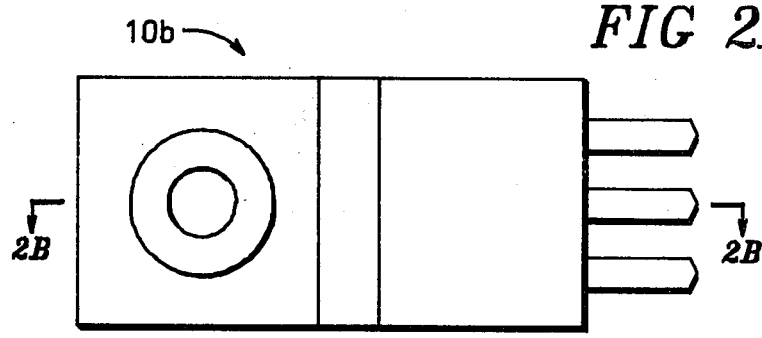
FIGS. 2A-B show respectively, a top view and a cross sectional view of a semiconductor device mounted on a metallic external heat sink via insulated mounting means, according to the present invention.
Figure 2B:
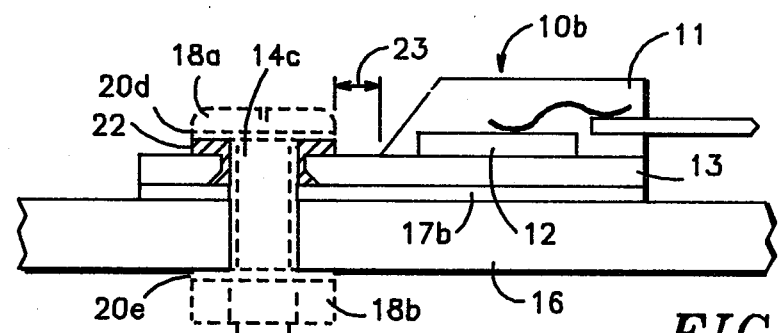

FIGS. 2A-B show, respectively, a top view and a cross-sectional view, in simplified form, of a typical semiconductor device having an integrally formed insulated mounting bushing, according to the present invention. Semiconductor device 10b has encapsulation 11 enclosing semiconductor die 12 which is mounted on metallic base and heat spreader 13. Head spreader 13 is attached to external heat sink 16 by means of fastener 18a-b. Electrical isolation between heat spreader 13 and external heat sink 16 is provided by means of integrally formed insulated bushing 22 and insulating spacer 17b. Insulating spacer 17b may be a separate piece-part, as with prior art insulator 17a or, may be integrally formed as a part of heat spreader 13. Integrally formed insulated bushing 22 has aperture or through-hole 14c to accommodate fastener 18a-b. Integrally formed insulated bushing 22 is separated from device encapsulation 11 by gap 23 so that mechanical forces applied during tightening of fastener 18a-b are not transmitted to semiconductor die 12 through the encapsulation. Insulated bushing 22 can be bonded to heat spreader 13 or retained mechanically.

In many power semiconductor devices, encapsulation 11 is a molded plastic. By modifying the mold configuration, insulated bushing 22 can be molded into metallic heat spreader 13 at substantially the same time and during the same operation in which encapsulation 11 is formed. Methods for modifying molds are well known in the art. Generally, the volume of plastic material required to form insulated bushing 22 is small compared to the amount required for encapsulation 11 so that only a slight amount of additional molding compound is required. All other operations required to form insulated bushing 22 are already being performed in connection with the formation of encapsulant 11. As a consequence, the increase in manufacturing cost to produce a device with integrally molded insulated bushing 22 is negligible. This is a significant practical advantage since the user obtains a device, at substantially the same cost, which can be used interchangeably as either a non-isolated device (by omitting insulator 17b), or as an isolated device (by including insulator 17b during mounting) while stocking only one interchangeable semiconductor device 10b. Additionally the cost of handling and installing isolation bushings 19a-b, which would otherwise be required, is avoided.

Gas 23 which separates insulated bushing 22 and encapsulation 11 is an important feature of this invention. It has been found that using a single connected plastic mass as both an encapsulant for the semiconductor die and as a means of isolating the fastener from the metallic base and/or heat spreader is undesirable. The mechanical forces applied by the fastener in clamping the combination of plastic encapsulant and heat spreader against the external heat sink are quite high. Even though the fastener and the semiconductor die are separated by an appreciable distance through the plastic material, it has been found that shear forces can be transmitted through the connecting plastic material. These shear forces can damage the semiconductor die or the relatively fragile electrical wires and connections to the semiconductor die which are embedded in the encapsulant. Thus, gap 23 exists for the express purpose of mechanically de-coupling insulated bushing 22 from encapsulant mass 11 so as to avoid transmission of mechanical forces through the plastic material.

Figure 3:
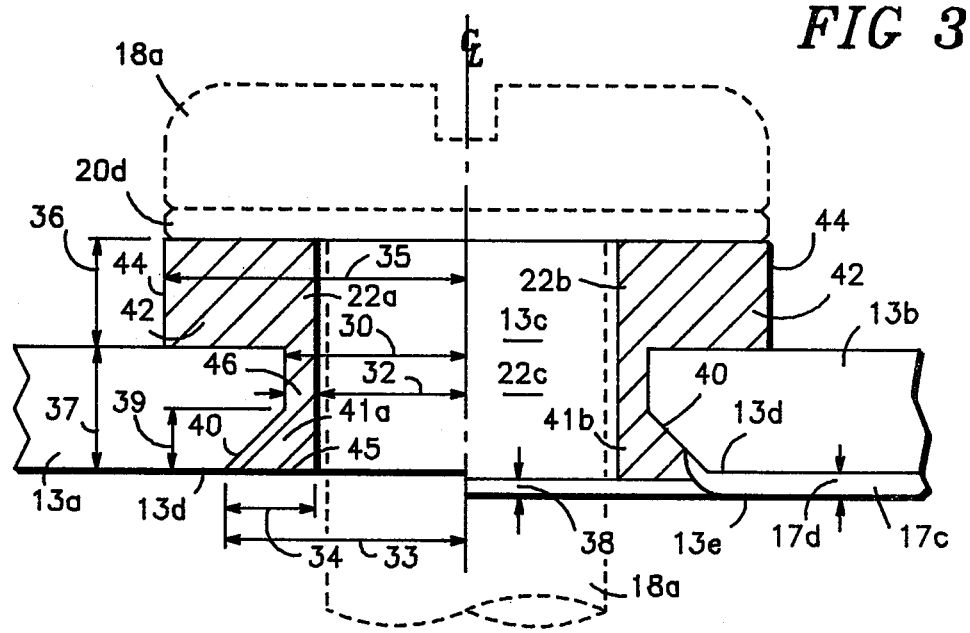
FIG. 3 shows in simplified form and according to the present invention an enlarged cross-sectional view of the molded-in insulated mounting bushing of the device of FIGS. 2A-B.

FIG. 3 shows an enlarged cross-sectional view of two embodiments of the insulated mounting bushing of the present invention. It is intended that surfaces 13d or 13e be coupled to the external heat sink. Heat spreader 13a-b has central through-hole or aperture 13c of principal radius 30. Through-hole 13c is chamfered at 40, adjacent surface 13d of heat spreader 13a-b. Chamfer 40 has radius 33 at surface 13d and depth 39. Formed in through-hole or aperture 13c is insulated bushing 22a-b, having central through-hole or aperture 22c substantially coaxial with through-hole 13c, and of internal radius 32. Radius 33 is larger than radius 30 and thus chamfered portion 40 has a larger cross-sectional extent than the central portion of through-hole 13c corresponding to radius 30. Radius 35 of shoulder portion or boss 42 is larger than radius 30, and thus also has a larger cross-sectional extent. These features insure that insulated bushing 22a-b is firmly retained in aperture 13c even if it is not bonded to heat spreader 13.

Left half 22a of bushing 22a-b illustrates a first embodiment in which portion 41a of bushing 22a-b is substantially flush with surface 13d of heat spreader 13a-b in the vicinity of chamfer 40. Right half portion 22b of insulated bushing 22a-b illustrates a second embodiment in which portion 41b of insulated bushing 22b is relieved from exterior surface 13e of heat spreader 13a-b by amount 38. Relief amount 38 permits surface 13e to be clamped in intimate contact with external heat sink 16 which allowing space for any drilling burrs which may exist around the mounting hole in external heat sink 16. It is desirable that bushing portions 41a or 41b not protrude beyond surfaces 13d or 13e so as not to interfere with uniform contact between heat spreader 13a-b, and the external heat sink.

Right half portion 22b of insulated bushing 22a-b also illustrates, in connection with heat spreader portion 13b, the use of integrally bonded insulating layer 17c to provide isolation between heat spreader 13b and the external heat sink to which it mounts. The advantage of this approach is that thickness 17d of insulating layer 17c may be made thinner than would be required where, as in FIG. 1, insulator 17a is a free-standing separate piece-part. Use of integrally bonded insulating layer 17c of smaller thickness improves the thermal performance by decreasing the thermal impedance. Integrally formed insulated bushing 22a-b of the present invention is compatible with the use of integrally bonded insulating layer 17c. It will also be readily apparent to those of skill in the art, that portion 41a of insulated bushing 22a in the left half of FIG. 3 could also be relieved from surface 13d of heat spreader portion 13a.

Since fastener portion 18a and optional washer 20d are likely to be at one electrical potential while heat spreader 13a-b is at a second electrical potential, arcing or flash-over can occur across surface 44 of shoulder portion or boss 42 of insulated bushing 22a-b. It is important therefor, that height 36 of shoulder 42 exceed the surface flash-over distance determined from the required operating voltage. The flash-over distance depends upon the operating voltage, the ambient, and the material of surface 44. Surface flash-over distances may be readily determined by experiment or estimated using published values well known in the art for common industrial materials and ambients. In a similar way, surface flash-over can occur along surface 45 of portion 41a of insulated bushing 22a-b. Thus distance 34 must also exceed the required surface flash-over distance.

Figure 4:
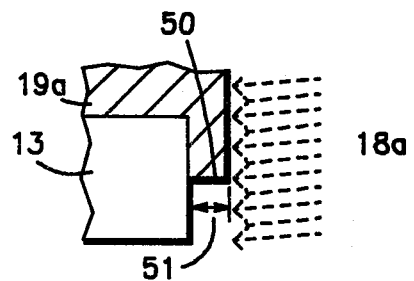
FIG. 4 shows in simplified form an enlarged cross-sectional view of a portion of the prior art device of FIG. 1, after mounting.

FIG. 4 shows a portion of heat spreader 13, insulated bushing 19a, and fastener portion 18a after the separate piece parts of FIG. 1 have been assembled. When fastener portion 18a is at one potential and heat spreader 13 is at another potential, it will be readily apparent that surface flash-over can take place on surface 50 of length 51. It is for this reason that the insulated mounting means of the prior art, illustrated in FIG. 1, is generally arranged with two bushings, 19a and 19b, which isolate fastener means 18a-b from both heat spreader 13 and external heat sink 16. With this arrangement, fastener means 18a-b will float at an electrical potential approximately half-way between the potentials of heat spreader 13 and heat sink 16. This reduces the electrical potential applied across surface 50 of distance 51 of FIG. 4 by approximately one-half. However, additional bushing 19b is required to accomplish this.

By comparing FIG. 4 with the corresponding region of FIG. 3 adjacent portion 41a, it will be readily apparent that, for any given fastener and mounting hole size, distance 34 along surface 45 of FIG. 3 is significantly increased over distance 51 of surface 50 of FIG. 4, producing a corresponding increase in the surface flash-over voltage capability of the insulated bushing of the present invention. With insulated bushing 22a-b of the present invention, distance 34 can be made several times the value of distance 51, and as a consequence, additional bushing 19b is no longer required since there is no longer a need to isolate the fastener itself or to use an insulated fastener. Thus, the present invention further reduces the cost of mounting the finished device.

Electrical breakdown can also proceed by discharges which pass through the bulk of the insulating material of the bushing. Accordingly, distance 46 between innerradius 32 and inner-radius 30 must be sufficient to withstand the desired breakdown voltage. However, this is usually not difficult in practice since the plastic materials, such as polyimides, epoxies, or silicones, commonly used for encapsulation of semiconductor devices, have bulk breakdown strengths substantially greater than the surface breakdown strength of the corresponding material. Additionally the bulk breakdown strength is not affected by surface contaminants which arise from the atmosphere of industrial applications where power devices are much used. The present design permits surface breakdown distances 34 and 36 to be controlled substantially independently of bulk breakdown distance 46 by, respectively, varying the angle of chamfer 40 and the height of shoulder 42. This is a significant advantage of the present design over the prior art.

The present invention thus provides an improved semiconductor power device package in which the integral molded-in insulated bushing, formed substantially at the same time as the device encapsulation, significantly simplifies and reduces the cost of isolating the heat spreader from the external heat sink without a significant increase in the cost of the manufacture of the device itself. Additionally the user enjoys the advantage of a single device type which can be interchangeably used for isolated (with insulator 17b) or non-isolated (without insulator 17b) applications with a minimum (one or none) of external piece-parts.

The shape of the through-hole in the heat spreader and the shape of the insulated bushing of the present invention, are such that the bushing is firmly retained in the heat spreader, that the surface flash-over distances can be separately controlled from the bulk breakdown distance and can be increased over those values obtainable in the prior art, and that structure of the present invention increases the breakdown voltage capabilities of the device without significant additional costs.

The structure of the present invention is both compatible with and well adapted for use with heat spreaders which have thereon an integral insulating layer for isolating the heat spreader from the external heat from the external heat sink, and that such an arrangement provides a low cost isolated device of improved thermal performance and breakdown voltage, and which requires no separate external piece-parts (other than the fastener) in order to achieve an insulated mounting.

Further, the present invention provides an integral insulated mounting bushing in a way which precludes the coupling of mechanical forces through the insulating plastic from the region of the bushing to the semiconductor die, thereby providing improved reliability over devices in which the plastic of the mounting bushing is connected with the plastic of the die encapsulation.

While the present invention has been illustrated and described in terms of a particular semiconductor device structure, for example a TO-220 type package, it will be apparent to those of skill in the art that the concepts embodied herein apply to a wide range of devices and packages types, as for example, TO-3, TO-66, and other type packages. Further, while manufacture is simplified by molding bushing 22 at the same time as the semiconductor dice is encapsulated and of the same material, particular device uses may benefit from using different materials molded at different times and/or formed in different ways, as for example by crimping an inserted insulating sleeve.

Accordingly, it is intended to encompass all such variations as fall within the spirit and scope of the present invention.

I claim:

1. A semiconductor device with an integral insulated mounting bushing, comprising:

an electrically and thermally conductive base member having a planar first surface for thermal coupling to an external heat sink, a second surface opposite said first surface, and a first aperture penetrating said base member from said first surface to said second surface, wherein said aperture has a first portion adjacent said first surface and a second portion adjacent said second surface, and wherein said first portion is of larger cross-sectional extent than said second portion; and a hollow insulating sleeve fixed within and substantially filling said aperture, having a first end substantially flush with said first surface and of a cross-sectional extent corresponding substantially to said first portion of said aperture, and a second end extending beyond said second surface to form a boss of predetermined height and a cross-sectional extent larger than said first aperture and having a second aperture penetrating said base member, and wherein said second aperture is substantially coaxial with said first aperture.

2. The semiconductor device of claim 1 wherein said first and second apertures are substantially cylindrical, wherein said second portion of said first aperture has a predetermined first internal radius, and wherein said sleeve has a second internal radius corresponding to said second aperture, a first external radius at said first end, a second external radius of said boss, and a third external radius corresponding substantially to said first internal radius of said second portion of said first aperture, and wherein said height of said boss is not less than a predetermined surface flash-over distance, and wherein said first and second external radii exceed said third external radii, and wherein said third external radius differs from said second internal radius by at least a predetermined bulk breakdown distance.

3. The semiconductor device of claim 2 wherein said first external radius differs from said second internal radius by not less than said predetermined flash-over distance.

4. The semiconductor device of claim 1 or 3 wherein said sleeve is bonded to said conductive base member and said first surface has an insulating layer bonded thereto.

5. The semiconductor device of claim 4 wherein said semiconductor device comprises a semiconductor chip enclosed by an encapsulation of molded plastic, and wherein said insulating sleeve is molded in said aperture from said plastic substantially simultaneously with said encapsulation.

6. The semiconductor device of claim 5 wherein said insulating sleeve and said encapsulation are separated so as to avoid transfer of mounting stresses through said plastic material from said insulating sleeve to said semiconductor device.

7. The semiconductor device of claim 6 wherein said first end of said sleeve is recessed from said first surface a predetermined relief distance.

8. A plastic encapsulated semiconductor device with insulated mounting means, adapted for mounting to an external heat sink by means of an electrically conductive fastener, comprising:

a metallic base having a substantially cylindrical first through-hole of a first radius penetrating said base from a first planar surface of said base adapted for thermally contacting said heat sink to a second surface of said base opposed to said first surface, wherein said first through-hole is chamfered to a predetermined depth adjacent to said first surface so as to have a larger second radius at said first surface of said base;

a semiconductor die coupled to said base;

external leads coupled to said semiconductor die;

an insulating plastic encapsulation molded around said semiconductor die; and an insulating plastic bushing molded with but separated from said encapsulation, substantially filling said first through-hole so as not to protrude beyond said first surface, and having a centrally located second through-hole substantially coaxial with said first through-hole and of a third radius smaller than said first radius, and having a flange on said second surface of a fourth radius larger than said first radius.

9. The device of claim 7 wherein said flange has a first height above said second surface not less than a predetermined surface flash-over distance, and wherein the difference between said second and third radii is not less than said surface flash-over distance.

10. The device of claim 8 wherein said plastic bushing is received below said first surface for a distance less than said depth of said chamfer.

* * * * *